United States Patent [19]
Nozaki et al.

[11] Patent Number: 4,677,289
[45] Date of Patent: Jun. 30, 1987

[54] COLOR SENSOR

[75] Inventors: Hidetoshi Nozaki; Toshikazu Adachi, both of Yokohama, Japan

[73] Assignee: Kabushiki Kaisha Toshiba, Kawasaki, Japan

[21] Appl. No.: 794,794

[22] Filed: Nov. 4, 1985

[30] Foreign Application Priority Data

Nov. 12, 1984 [JP] Japan ............................ 59-236711
Mar. 25, 1985 [JP] Japan ............................ 60-59867

[51] Int. Cl.⁴ .......................... G01J 3/50; H01J 40/14
[52] U.S. Cl. .................................. 250/226; 250/578; 357/30
[58] Field of Search .................. 250/226, 208, 211 R, 250/578, 209, 211 J; 357/30

[56] References Cited
U.S. PATENT DOCUMENTS

4,387,265  6/1983  Dalal .......................... 357/30 X
4,581,625  4/1986  Gay et al. ..................... 357/30

Primary Examiner—Eugene R. Laroche
Assistant Examiner—David Mis
Attorney, Agent, or Firm—Oblon, Fisher, Spivak, McClelland & Maier

[57] ABSTRACT

A color sensor comprises a cell group comprised of a plurality of photovoltaic cells having a different photosensing wavelength area and being electrically, series-connected, a connection circuit electrically connected across both terminals of the cell group to provide an electrically closed circuit, and a sensing circuit adapted to sense a voltage across both terminals of the respective photovoltaic cell and to evaluate a color component of light incident on the color sensor.

17 Claims, 22 Drawing Figures

COLOR SENSOR

BACKGROUND OF THE INVENTION

This invention relates to a color sensor.

A color sensor using a single crystalline silicon and amorphous slicon (a-Si) is known in the art. For example, a color sensor using a-Si is disclosed in Japanese Laid-Open Publication (KOKAI) Nos. 58-106863, 58-31585, 58-12585, 58-12586, 58-12587, 58-12588 and 58-12589.

However, the conventional color sensor necessarily requires red, green and blue color filters, providing a cause for high costs. In order to split an incident light beam containing color components of various wavelengths into red, green and blue color components (the three primaries of light), three photosensing areas at most need to be arranged in a planar array, serving to impede enhancement of image resolution.

As a solution to this problem, for example, Japanese Laid-Open Publication (KOKAI) Nos. 58-4143 and 59-4184, for example, disclose a color sensor having photosensing areas which are stacked one over another. This color sensor is adapted to sense the incident light color in accordance with a ratio of the magnitudes of photocurrents in the photosensing areas.

However, this method is only effective on an incident monochromatic light beam, and it has been difficult to identify the various color components into which the incident light beam containing various color components is separated. Furthermore, this color sensing method is complex, because, subsequent to the sensing of the ratio of photocurrents, a color corresponding to this ratio must be evaluated.

SUMMARY OF THE INVENTION

One object of this invention is to provide a color sensor of the voltage sensing type, which can readily sense color components of an incident light beam without the need of using various color filters.

Another object of this invention is to provide a color sensor which is higher in image resolution than a conventional color sensor.

Another object of this invention is to provide a color sensor which can sense the wavelength of an incident light by means of a very simple arrangement.

In order to achieve the above-mentioned object, there is provided a color sensor comprising a cell group comprised of a plurality of photovoltaic cells, each having a different photosensing wavelength area and being electrically connected in series; a connection line electrically connected between both terminals of the cell group to form a closed circuit, and a sensing circuit for detecting a voltage across each photovoltaic cell and for evaluating color components of light incident on the color sensor.

The color sensor according to this invention can sense color components of incident light without the need of providing various color filters at the light receiving side.

In the past, three kinds of photosensing areas using, for example, red, green and blue color filters were arranged in a planar array to identify color components of incident light. According to this invention, since respective photodiodes are stacked one over another, it is possible to identify the color components of light incident on a small area, i.e., one kind of photosensing area when viewed in a planar plane. It is therefore possible to greatly enhance the image resolution of incident color light.

The intensity of an incident light beam of a certain wavelength component is in proportion to a voltage across the respective diodes to which the color component is allotted, permitting a ready evaluation of the incident-light intensity. Furthermore, an increase in the number of series-connected photodiodes assures an enhanced sensitivity with which the incident light can be identified. The mere addition of any light-insensitive diode or resistor can also result in enhanced sensitivity. Moreover, the color sensor of this invention is also characterized in that it can rather readily identify the color of any incident light, even if it is weak. That is, this invention can also find an application as a color sensor or image sensor for detecting weak level light.

BRIEF DESCRIPTION OF THE DRAWINGS

Other objects and advantages will be apparent from the following description when it is taken in conjunction with the accompanying drawings, in which.

DETAILED DESCRIPTION OF THE PREFERRED EMBODIMENTS

Figure 1:
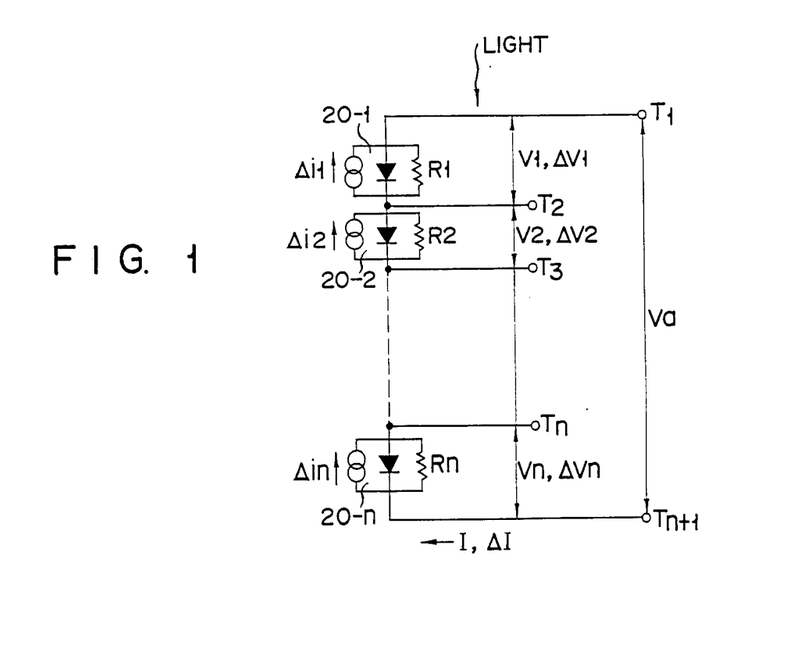
FIG. 1 is an equivalent circuit showing a color sensor according to this invention.

FIG. 1 shows one example of an equivalent circuit showing a color sensor according to this invention.

The operation principle of the color sensor according to this invention will be explained below, using the equivalent circuit. In this equivalent circuit a light beam is incident on the color sensor with the polarities of photodiodes arranged in the same direction. FIG. 1 shows the photodiodes 20-1, 20-2, ..., 20-n. $V_a$ shows a voltage applied between a terminal $T_1$ and a terminal $T_{n+1}$ in the equivalent circuit. $V_1, V_2, ..., V_n$ are voltages across the photodiodes. The voltage is forward when it is positive and reverse when it is negative. $R_1, R_2, ..., R_n$ are resistors, each of which is connected in parallel with the corresponding photodiode. Resistors connected in series with the corresponding photodiode (20-1, 20-2, ..., 20-n) can be omitted if a current $I_m$ through the respective photodiodes is designed to be of a small but adequate level, where m=1, 2, ..., n.

When a light beam is incident on the color sensor, a photocurrent of $\Delta i_m$ (m=1, 2, ..., n) is generated through an m-th photodiode. If a diode is to be arranged in the m-th position, it is only necessary that $\Delta i_m = 0$. Similarly, if it is designed that a light beam not be entered onto the m-th photodiode, it is only necessary that $\Delta i_m = 0$. since the respective photodiodes are connected in a series fashion, a variation $\Delta I_m$ (m=1, 2, ..., n) of a current $I_m$ through the respective photodiodes becomes equal to a variation $\Delta I$ of a current flowing between the terminals $T_1$ and $T_{n+1}$. Where the photocurrent $\Delta i_m$ (m=1, 2, ..., n) takes on a different value, a voltage $\Delta V_m$ (m=1, 2, ... n) is generated, as a variation, across the m-th photodiode, that is, across the terminals $T_m$ and $T_{m+1}$. Needless to say, as long as the application voltage $V_a$ is constant, the sum of $\Delta V_m$ (m=1, 2, ..., n) becomes a zero volt.

The equivalent circuit, before the light beam is incident on the color sensor, can be expressed as follows:

$$I = I_m \quad (m = 1, 2, \ldots, n) \tag{1}$$

$$V_a = \sum_{m=1}^{n} V_m \tag{2}$$

$$I_m = -I_{om}\left[\text{Exp}\left(\frac{q \cdot V_m}{n_m kT}\right) - 1\right] - \frac{V_m}{R_m} \tag{3}$$
$(m = 1, 2, \ldots, n)$ where
q: electron charge
$I_{om}$ and $n_m$: saturated current value and diode factor n-value of the m-th photodiode
k: Boltzmann's constant
T: absolute temperature The equivalent circuit when the light beam is incident on the color sensor is as given below:

$$\Delta I = \Delta I_m \quad (m = 1, 2, \ldots, n) \tag{4}$$

$$0 = \sum_{m=1}^{n} \Delta V_m \tag{5}$$

$$I + \Delta I_m = \Delta i_m - \tag{6}$$

$$I_{om}\left[\text{Exp}\left(\frac{q(V_m + \Delta V_m)}{n_m kT}\right) - 1\right] - \frac{V_m + \Delta V_m}{R_m}$$
$(m = 1, 2, \ldots, n)$ From equations (3) and (6), the following equation can be obtained $$\Delta I_m = \Delta i_m - \tag{7}$$

$$I_{om}\left[\left\{\text{Exp}\left(\frac{q \cdot V_m}{n_m kT}\right)\right\}\left\{\text{Exp}\left(\frac{q \cdot \Delta V_m}{n_m kT}\right) - 1\right\}\right] - \frac{\Delta V_m}{R_m}$$

Where a design consideration is so given as to make $q \cdot \Delta V_m$ adequately smaller than $n_m kT$, then equation (7) can be approximated as given below:

$$\Delta I_m = \Delta i_m - \left[\frac{q \cdot I_{om}}{n_m kT}\text{Exp}\left(\frac{q \cdot V_m}{n_m kT}\right) + \frac{1}{R_m}\right]\Delta V_m \tag{I}$$

The above-mentioned equations can be rearranged as follows:

$$V_a = \sum_{m=1}^{n} V_m \tag{2}$$

$$\Delta I = \Delta I_m \quad (m = 1, 2, \ldots, n) \tag{4}$$

$$0 = \sum_{m=1}^{n} \Delta V_m \tag{5}$$

$$\Delta I_m = \Delta i_m - W_m \cdot \Delta V_m \tag{9}$$
$(m = 1, 2, \ldots, n)$ $$W_m = \frac{q \cdot I_{om}}{n_m kT}\text{Exp}\left(\frac{q \cdot V_m}{n_m kT}\right) + \frac{1}{R_m} \tag{10}$$
$(m = 1, 2, \ldots, n)$ $$q \cdot \Delta V_m << n_m kT \tag{11}$$

From equations (4), (5) and (9) the following equations are obtained for $\Delta I$ and $\Delta V_m$.

$$\Delta I = \sum_{m=1}^{n}\left(\frac{\Delta i_m}{W_m}\right) / \sum_{m=1}^{n}\left(\frac{1}{W_m}\right) \tag{12}$$

$$\Delta V_m = \frac{1}{W_m}(\Delta i_m - \Delta I) \tag{13}$$

$$= \frac{1}{W_m}\left[\Delta i_m - \sum_{m=1}^{n}\left(\frac{\Delta i_m}{W_m}\right) / \sum_{m=1}^{n}\left(\frac{1}{W_m}\right)\right]$$

$$= \frac{1}{W_m \cdot \sum_{m=1}^{n}\left(\frac{1}{W_m}\right)}\left[\Delta i_m \cdot \sum_{k \neq m}^{n}\left(\frac{1}{W_m}\right) - \right.$$

$$\left. \sum_{k \neq m}^{n}\left(\frac{\Delta i_k}{W_k}\right)\right]$$

Now, suppose that a light beam having the wavelength distribution of a photon number density, as indicated by $F(\lambda)$, is incident on a color sensor from the photodiode (20-1) side.

The m-th photodiode receives the light beam which has passed through (m-1) number of photodiodes. In this case, assume that the m-th photodiode has the wavelength distribution of the collection efficiency indicated by $\eta_m(\lambda)$.

Then, a photocurrent $\Delta i_m$ generated at the m-th photodiode attains the level obtained by integrating $F(\lambda) \cdot \eta_m(\lambda)$ over the whole wavelength range.

$$\Delta i_m = q \int F(\lambda) \eta_m(\lambda) d\lambda \quad (14)$$

$$(m = 1, 2, \ldots, n)$$

Substituting equation (4) into equations (12) and (13) yields the following equations:

$$\Delta I = q \cdot \sum_{m=1}^{n} \int \left( F(\lambda) - \frac{\eta_m(\lambda)}{W_m} \right) d\lambda / \sum_{m=1}^{n} \left( \frac{1}{W_m} \right) \quad (15)$$

$$\Delta V_m = \quad (16)$$

$$\frac{q}{W_m \cdot \sum_{m=1}^{n} \left( \frac{1}{W_m} \right)} \int F(\lambda) \left[ \left\{ \sum_{k \neq m}^{n} \left( \frac{1}{W_k} \right) \right\} \eta_m(\lambda) - \sum_{k \neq m}^{n} \left( \frac{\eta_k(\lambda)}{W_k} \right) \right] d\lambda$$

Now consider the value $W_m$ (m = 1, 2, ..., n) as shown in equation (10), where m = 1, 2, ..., n.

With T representing room temperature, the following relations are established for an ordinary diode:

$$I_{om} < 10^{-8} (A/cm^2)$$

$$2 \times 10^{-2}(eV) < kT < 3 \times 10^{-2}(eV)$$

$$1 < n_m < 2$$

$$R_m < 100(k\Omega \cdot cm^2)$$

Thus, $$\frac{q \cdot I_{om}}{n_m kT} \operatorname{Exp}\left( \frac{q \cdot V_m}{n_m kT} \right)$$

may be sufficiently smaller than $1/R_m$ when $V_m$ is a positive value of a sufficiently smaller level, at a zero level or a negative value. That is, it is only necessary to set $V_m$ in a range where the depletion layer of each diode is of such a width that the injection of minority carriers can be disregarded.

This requirement can readily be satisfied if $V_a$ is set at a desired level. It is desirable that, in practice, $V_a = 0$ volt and $V_m = 0$ volt (m = 1, 2, ... n) because the level $\Delta V_m$ can readily and directly be sensed as a voltage across the m-th photodiode. Then, equation (10) can be regarded as:

$$W_m \approx 1/R_m \quad (17)$$

$$(m = 1, 2, \ldots, n)$$

Each photodiode can be readily designed to have equal parallel resistances $R_m$. For example, it is only necessary to connect, across each photodiode, a resistor of a level at which the inherent parallel resistance of the respective photodiodes can be disregarded.

As a result, the value $W_m$ of each of the respective diodes can be equalized, as given below:

$$W = W_m \quad (18)$$

$$(m = 1, 2, \ldots, n)$$

Substituting equation (18) into equations (15) and (16) gives:

$$\Delta I = q \cdot \sum_{m=1}^{n} \int F(\lambda) \overline{\eta}_m(\lambda) d\lambda / n \quad (19)$$

$$\Delta V_m = \frac{q}{n \cdot W} \int F(\lambda) \left[ (n-1) \eta_m(\lambda) - \sum_{k \neq m}^{n} \eta_k(\lambda) \right] d\lambda \quad (20)$$

$$= \frac{q}{n \cdot W} (S_{m1} - S_{m2})$$

$$\left. \begin{array}{l} S_{m1} = \int F(\lambda)(n-1) \eta_m(\lambda) d\lambda \\ S_{m2} = \int F(\lambda) \sum_{k \neq m}^{n} \eta_k(\lambda) d\lambda \end{array} \right\} \quad (21)$$

The voltage $\Delta V_m$ generated across the m-th photodiode (including a diode) due to the incidence of the light beam was indicated in equation (13). It was evident that equation (13) was simplified to equation (20) by designing the respective photodiodes such that its value $W_m$ (m = 1, 2, ..., n) is equal.

The function of the color sensor of this invention will be explained below on the basis of equation (20). Where a wide overlap occurs between $F(\lambda)$ and $\eta_m(\lambda)$ of the m-th photodiode, the value $S_{m1}$ becomes sufficiently greater than the value $S_{m2}$ and $\Delta V_m$ takes on a positive value. With a decreasing overlap between $F(\lambda)$ and $\eta_m(\lambda)$, $S_{m1}$ is decreased while $S_{m2}$ is increased, and the absolute value of $\Delta V_m$ is decreased. With a further decrease in their overlap, $\Delta V_m$ eventually takes on a negative value. From this it is found that the sign and absolute value of $\Delta V_m$ show the extent of an overlap as a function of $F(\lambda)$ and $\eta_m(\lambda)$.

If each photodiode is allotted a color corresponding to $\eta_m(\lambda)$ (m = 1, 2, ..., n), the kind and strength of color components in $F(\lambda)$ can readily be identified by sensing the position number of the photodiode from which a positive voltage is generated, and the magnitude of the positive voltage.

In order to increase the sensitivity with which the color components of the incident light is identified, it is necessary only to increase the number of series-connected photodiodes (including diodes).

As already stated above, $q \cdot \Delta V_m << n_m kT$ is necessary to meet the requirements of equation (8). If necessary, the requirements can readily be satisfied by using a filter capable of adjusting the amount of incident light.

The value of $W_m$ can be adjusted by adjusting the magnitude of a parallel-connected resistor $R_m$ inherent in the respective photodiodes (including diodes). Without providing any filter for adjusting the amount of incident light, it is possible to decrease the value of $\Delta V_m$ and to satisfy the requirements of:

$$q \cdot \Delta V_m < < n_m kT$$

It is only necessary to adjust the value of $W_m$ by connecting a resistor of a proper value across the respective photodiodes (including a diode). If a resistor of a level at which the parallel resistor inherent in the respective photodiodes can be disregarded is connected, it is easy to set $W_m$ (m=1, 2, ..., n) at an equal value.

As evident from equation (5) the sum of voltages generated across the respective photodiodes (including diodes) owing to the incidence of the light becomes zero. Thus, if n number of photodiodes (including diodes) is connected in a series configuration, it is possible to identify the clors of incident light over a range of (n-1) kinds of color components.

The embodiments of this invention will be explained below in more detail. A color sensor comprised of two kinds of photodiodes stacked one over the other in series configuration will be explained below as a first embodiment of this invention.

Figure 2A:
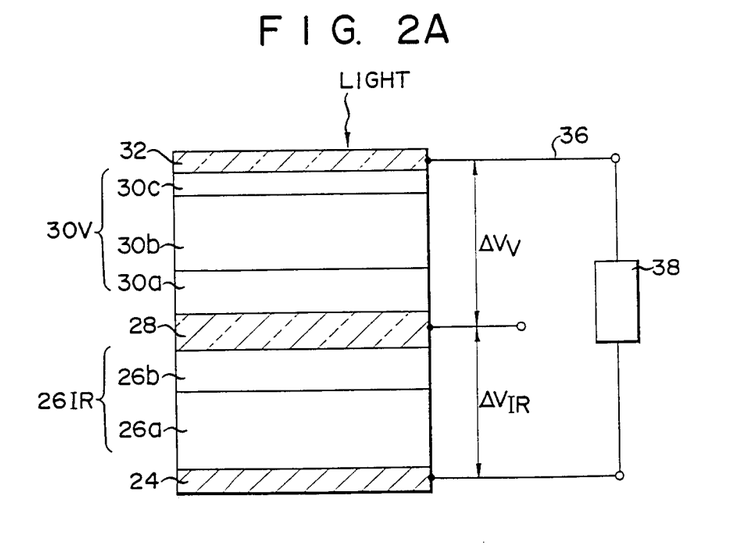
FIGS. 2A and 2B are cross-sectional views showing the color sensor according to a first embodiment of this invention.
Figure 2B:
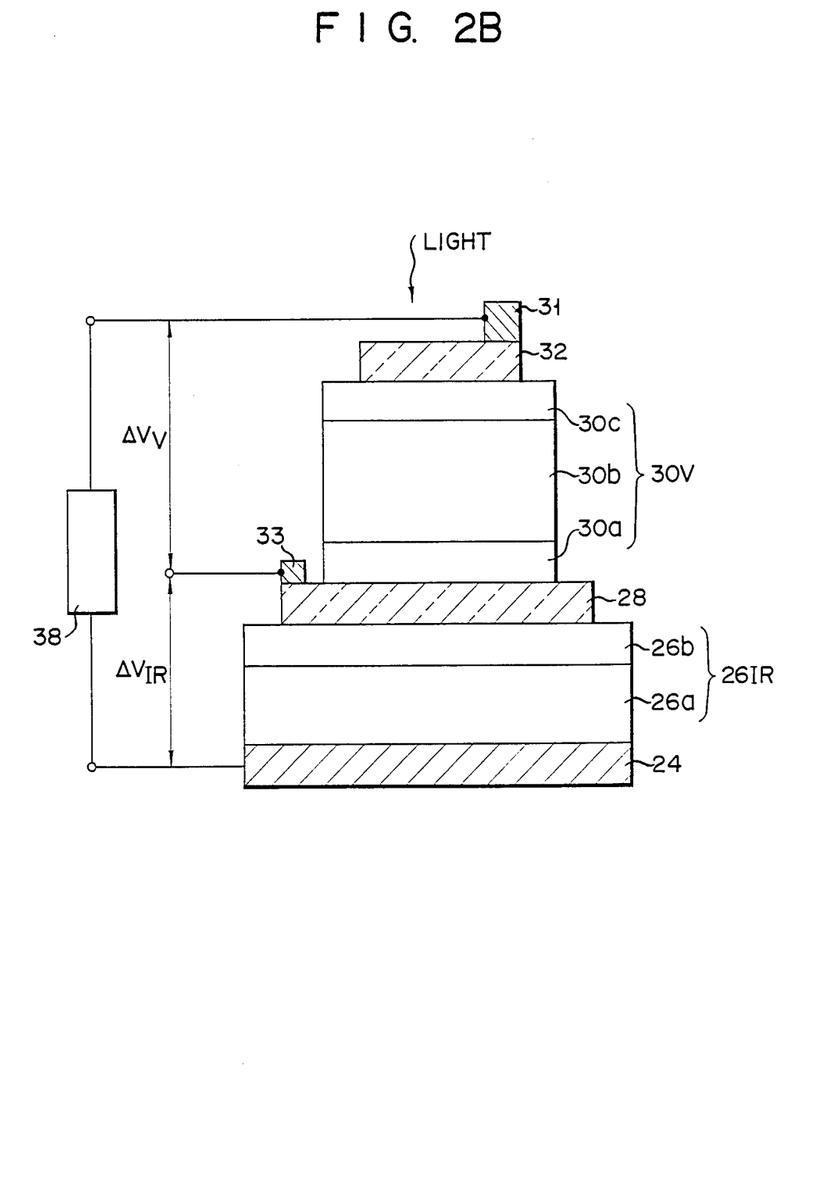

FIGS. 2A and 2B show a structural model and a cross-sectional view showing one example of a practical arrangement. An approximately 300 nm-thick microcrystalline silicon ($\mu$c-Si) 26b of an N-type is formed on a P-type poly c-Si substrate 26a having an electrode 24 made of a metal such as aluminum on its rear side, thus providing a photodiode 26IR for sensing primarily red colored light. Then, an ITO (Indium-Tin-Oxide) layer or $SnO_2$ layer 28 is formed, by sputtering, as a transparent conductive layer on the resultant structure so as to have a thickness of about 70 nm. Then, a 100 nm-thick a-Si layer 30a of a P-type, 500 nm-thick a-Si layer 30b of an I-type and 20 nm-thick a-Si layer 30c are deposited, in that order, on the surface of the resultant structure to provide a PIN-type photodiode 30V for sensing visible light. Finally, an 80 nm-thick ITO layer 32 which serves as a reflection-preventing layer is formed on the light receiving side of the resultant structure. As a practical arrangement, as shown in FIG. 2B, a color sensor may be manufactured to include a double structure of a lower photodiode 26IR and an upper photodiode 30V having a different surface area. An Al electrode 31, 33 may be formed, as an external connection electrode, on an ITO 28, 32.

The photodiodes 30V and 26IR may be formed, as a proper combination of semiconductor materials of AlSb, GaP, GaAs, GaAlAs, GaSb, InP, InAs, InSb, ZnS(hex), ZnSe, ZnTe, CdS(hex), CdTe, Si(hex), PbTe, $Cu_2S$ and CdSe(hex), so as to sense the proper wavelength corresponding to each forbidden bandwidth.

The a-Si and $\mu$c-Si layers may be formed by applying a high frequency power of 13.56 MHz to an inlet gas and using a glow discharge decomposition method. In this case, the substrate temperature may be set within a range of 150° to 250° C. and the gas pressure may be set within a range of 1 to 2 torrs. Silane ($SiH_4$) and diborane ($B_2H_6$) gases may be introduced into a plasma reactor when the P-type a-Si layer is formed; the silane gas when the I-type a-Si is formed and the silane and phosphine ($PH_3$) gases when the N-type a-Si is formed.

In accordance with the wavelength of the incident light, a voltage $\Delta V_V$ is generated across the photodiode 30V and a voltage $\Delta V_{IR}$ is generated across the photodiode 26IR. 36 denotes a closed circuit electrically connected across the color sensor, and 38 denotes a power source for applying a voltage to both the terminals of the color sensor. In this embodiment, the closed circuit is short-circuited. Here, with $W_m$ and $\eta_m(\lambda)$ of the respectively photodiodes 30V and 26IR representing $W_V$, $\eta_V(\lambda)$ and $W_{IR}$, $\eta_{IR}(\lambda)$, $\Delta V_V$ and $\Delta V_{IR}$ can be given, as below, from equation (16):

$$\Delta V_V = q/(W_V + W_{IR}) \int F(\lambda)[\eta_V(\lambda) - \eta_{IR}(\lambda)] d\lambda \quad (22)$$

$$\Delta V_{IR} = q/(W_V + W_{IR}) \int F(\lambda)[\eta_{IR}(\lambda) - \eta_V(\lambda)] d\lambda \quad (23)$$

Figure 3A:
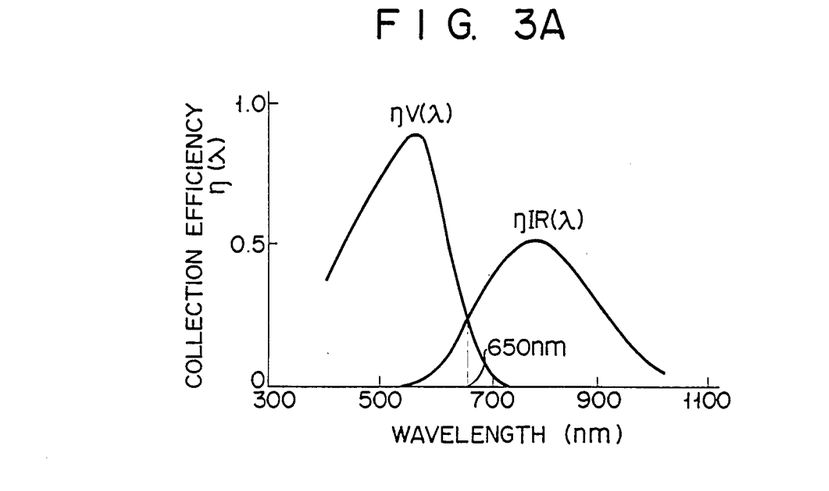
FIG. 3A shows collection efficiency spectra of respective photodiodes of the color sensor according to the first embodiment of this invention.
Figure 3B:
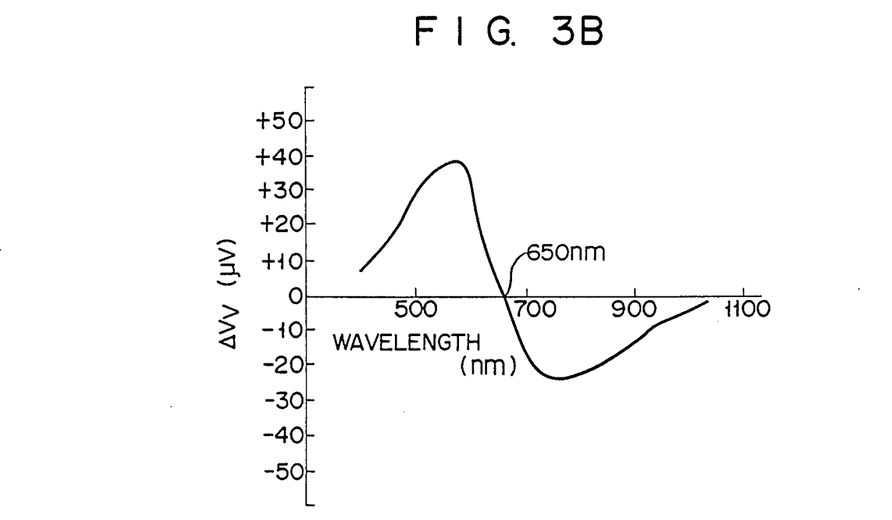
FIG. 3B shows the relation between a voltage across the photodiode of the color sensor of FIG. 2 and the wavelength.

FIG. 3A shows the collection efficiency spectra $\eta_V(\lambda)$, $\eta_{IR}(\lambda)$ of the respective photodiodes, and FIG. 3B shows a voltage spectrum $\Delta V_V(\lambda)$ generated when monochromatic light having a predetermined number of photons per unit time, that is, a range of $10^{11}$ to $10^{12}$ (photons/sec) is incident on the color sensor.

When $\eta_V = \eta_{IR}(\lambda)$, the wavelength $\lambda$ is about 650 nm. According to equation (22), $\Delta V_V$ becomes a positive voltage for $\lambda < 650$ nm and becomes a negative voltage for $\lambda > 650$ nm. That is, the photodiode 30V can sense the visible light by the positive voltage thereacross and the photodiode 26IR can sense infrared light mainly.

Figure 4:
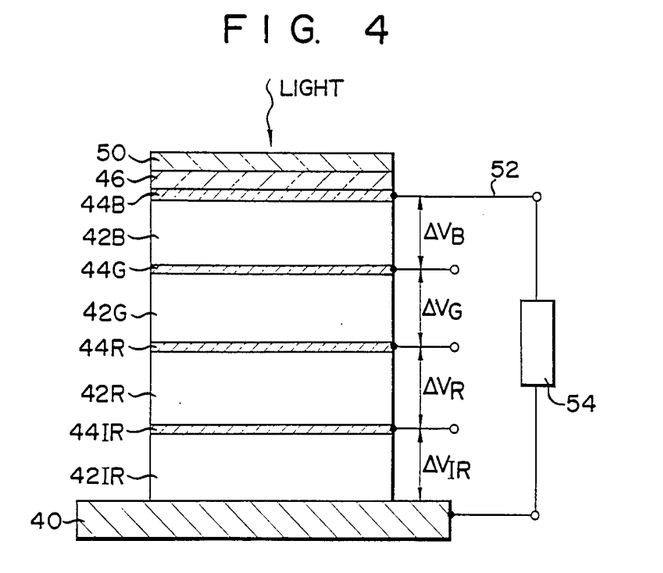
FIGS. 4 and 5 are cross-sectional views showing color sensors according to second and third embodiments of this invention.
Figure 5:
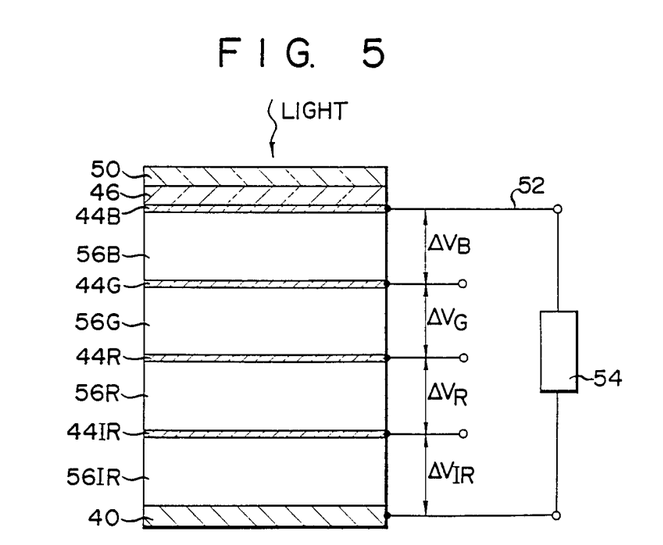

A color sensor according to second and third embodiments of this invention will be explained below. FIGS. 4 and 5 each show a model of the color sensor in cross section. In FIG. 4, the respective photodiodes are made of a-Si and 40 shows a conductive substrate such as stainless steel. 42B, 42G, 42R and 42IR show four photodiodes of different photosensing wavelengths which are formed one over another on one side of the major surface of the conductive substrate 40. The photodiodes 42B, 42G, 42R and 42IR have such a wavelength distribution of collection efficiency (collection efficiency spectra) $\eta_B(\lambda)$, $\eta_G(\lambda)$, $\eta_R(\lambda)$ and $\eta_{IR}(\lambda)$ as to sense blue, green, red and infrared light, respectively, and are arranged in that order when viewed in the light-incident direction. Reference numerals 44B, 44G, 44R and 44IR are transparent conductive layers and serve both as connection terminals for series-connecting photodiodes, and also as layers for transmitting the incident light to the underlying photodiodes. 46 shows an infrared light, cut-filter which is used to prevent a photocurrent from being produced in the infrared sensitive photodiode 42IR. As a result, even if white-colored light containing an infrared light component is incident on the color sensor, a negative voltage will always be produced across the photodiode 42IR. Therefore, the white-colored light can be separated for identification into the blue-, green- and red-color components of the visible light range in accordance with the output levels $\Delta V_B$, $\Delta V_G$ and $\Delta V_R$ of the positive voltages which are generated across the photodiodes 42B, 42G and 42R. Needless to say, an infrared cut-filter 46 is necessary only when infrared containing white-colored light is separated into its visible light components. The filter 46 is not necessary if monochromatic light is incident, if only the infrared light is to be sensed, or if a white-colored light containing no infrared component is separated into is blue-, green- and red-color components.

50 is an incident light-amount controllable filter, for example, a neutral density filter. The amount of incident light can be controlled by, in place of the neutral density filter 50, another incident light-amount controllable means such as a beam expander. In this connection it is to be noted that, if the amount of incident light is small enough to satisfy equation (11), such an incident light-amount controllable means is not necessarily required. The voltages $\Delta V_B$, $\Delta V_G$, $\Delta V_R$, and $\Delta V_{IR}$, which are generated across the photodiodes 42B, 42G, 42R, and 42IR in accordance with the incident light wavelengths, take on positive values when they are of a forward direction, and take negative values when they are of a reverse direction.

52 shows a closed circuit electrically connected across the color sensor to supply the color sensor with a constant voltage through a power source 54. The photodiodes 42B, 42G, 42R, and 42IR are comprised of, for example, PIN-type, a-Si photodiodes.

In the above-mentioned arrangement, the photodiodes 42B, 42G, 42R, and 42IR sense incident light components of blue, green, red and infrared to produce the corresponding positive voltages in accordance with the intensities of the incident light, and to produce negative voltages when there are no photosensing light components.

In the arrangement of FIG. 5, the respective photodiodes 56B, 56G, and 56R may be comprised of a-Si and c-Si (crystalline Si), or poly c-Si. 56IR shows an infrared light-sensitive c-Si or poly c-Si having a rear electrode 40. $\Delta V_B$, $\Delta V_G$, $\Delta V_R$ and $\Delta V_{IR}$ show voltages produced across the photodiodes 56B, 56G, 56R and 56IR. The arrangement of the other aspects of the color sensor is similar to that in FIG. 4.

The method for manufacturing the color sensor of FIG. 4 will now be explained below. The photodiodes 42B, 42G, 42R, and 42IR are comprised of a PIN-type a-Si or a μc-Si layer. These photodiodes are formed by introducing gas into a plasma reactor and, after the substrate temperature and gas pressure have been set at predetermined levels, applying a high frequency power of 13.56 MHz to cause a glow discharge decomposition.

The P-type layer is formed through a glow discharge decomposition of a silane ($SiH_4$) and a diborane ($B_2H_6$) gas, and the N-type layer is formed through the glow discharge of a silane and a phosphine ($PH_3$) gas. The I-type layer is formed by mixing, with a silane gas, and a germane ($GeH_4$), a methane ($CH_4$), an ammonia ($NH_3$), and a hydrogen ($H_2$) gas on the other gases in accordance with a desired optical band gap; followed by a glow discharge decomposition. In an alternative method, the a-Si and μc-Si layers may be formed through the use of a photo-CVD. It is desired that the collection efficiency spectra of the respective photodiodes 42B, 42G, 42R, and 42IR be restricted mostly to within the ranges corresponding to a blue component (λ (wavelength)~450 nm), a green component (λ~550 nm), a red component (λ~650 nm) and an infrared component (λ>750 nm), and that a substantially equal peak level occur at the respective photodiodes in the collection efficiency spectra.

The above-mentioned structure can be achieved by, for the most part, adjusting the optical band gap (Eg(i)) and layer thickness (di) of the I-type layer of the respective photodiodes. It is only necessary that, for example, Eg(i) be above 2.0 eV at di=below 150 nm for the photodiode 56B; Eg(i) be 2.0~1.8 eV at di=below 500 nm for the photodiode 56G; Eg(i) be 1.8~1.6 eV at di=below 1,000 nm for the photodiode 56R; and Eg(i) be 1.6~1.4 eV at di=below 1,500 nm for the photodiode 56IR. By adjusting the optical band gap and thickness of the P- and N-type layers in the photodiode it is also possible to correct, to a desired level, the shape of the collection efficiency spectrum in the underlying photodiode, in particular, the shape at the short-wavelength side.

Thus, the collection efficiency spectra of the respective photodiodes can easily be designed by using the absorption efficiency spectra and thicknesses of the P, I and N layers in the color sensor.

In order for Eg(i) to attain above 2.0 eV, I-type a-SiC:H and a-SiN:H may be formed by, for example, either lowering the substrate temperature to a level of below 200° C., or carrying out a glow discharge decomposition through the mixing of a hydrogen, a methane or an ammonium gas with the silane gas. In order for Eg(i) to attain 2.0 eV~1.7 eV, it is only necessary to set the substrate temperature to within a range of 150° C. to 400° C. upon formation of an I-type layer through the glow discharge decomposition of the silane gas. In order for Eg(i) to attain a level of below 1.7 eV, it may be possible to raise the substrate temperature above 350° C., or, the most frequently used is a method for forming an I-type a-SiGe:H layer through the mixing together of the silane and germane gases and the consequent glow discharge decomposition.

In this way, the respective photodiodes are formed. Transparent conductive layers 44B, 44G, 44R and 44IR may be formed by a sputtering method using an ITO (Indium-Tin-Oxide) or $SnO_2$.

In FIG. 5, the photodiode 56IR is formed by a diffusion method as a PN-type c-Si or a PN-type poly-Si. The photodiode 56IR may be constructed of a PN-type heterojunction which is formed by stacking a-Si or μc-Si on c-Si or poly c-Si. The optical band gap of c-Si and poly c-Si is 1.1 eV, so the photodiode 56IR senses an infrared light having a wavelength within about 1,100 nm. The collection efficiency spectrum of the photodiode 56IR varies, depending upon the laminated structure of the overlying photodiodes 56IR, or upon the diffusion length of minority carriers. Since the absorption efficiency spectra of the c-Si and poly c-Si are known, it is easier to design, as desired, the collection efficiency spectra if the diffusion length is properly selected.

The method for forming the other constituent elements, as shown in FIG. 5, is the same as that shown in FIG. 4. In the arrangements of FIGS. 4 and 5 the respective photodiodes were so designed as to have an equal value of $W_m$.

From equation (20), voltages across the respective photodiodes can be written as follows:

$$\Delta V_B = \tfrac{q}{4W} \int F(\lambda)[3\eta_B(\lambda) - \eta_G(\lambda) - \eta_R(\lambda) - \eta_{IR}(\lambda)]d\lambda \quad (24)$$

$$\Delta V_G = \tfrac{q}{4W} \int F(\lambda)[3\eta_G(\lambda) - \eta_R(\lambda) - \eta_{IR}(\lambda) - \eta_B(\lambda)]d\lambda \quad (25)$$

$$\Delta V_R = \tfrac{q}{4W} \int F(\lambda)[3\eta_R(\lambda) - \eta_{IR}(\lambda) - \eta_B(\lambda) - \eta_G(\lambda)]d\lambda \quad (26)$$

$$\Delta V_{IR} = \tfrac{q}{4W} \int F(\lambda)[3\eta_{IR}(\lambda) - \eta_B(\lambda) - \eta_G(\lambda) - \eta_R(\lambda)]d\lambda \quad (27)$$

The peak levels of the collection efficiency spectra were so designed as to be equal to $\eta_o$.

Figure 6A:
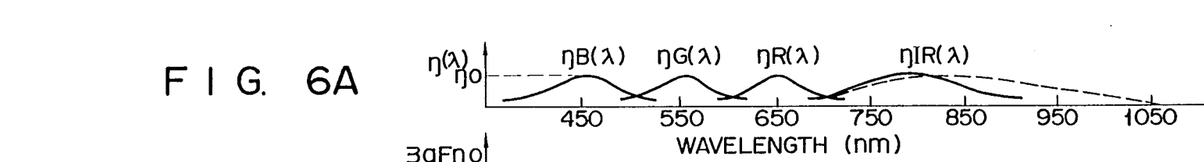
FIG. 6A shows a collection efficiency spectrum of each photodiode of the color sensors of FIGS. 4 and 5.
Figure 6B:
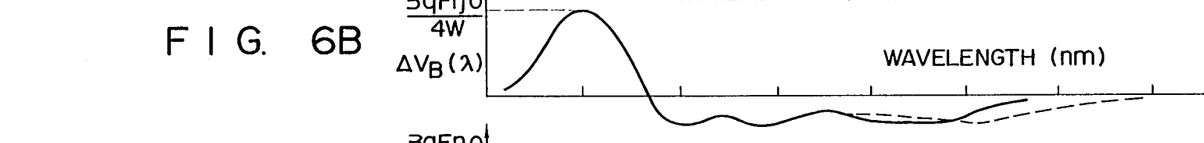
FIGS. 6B to 6E each show spectra of voltages $\Delta V_B(\lambda)$, $\Delta V_G(\lambda)$, $\Delta V_R(\lambda)$ and $\Delta V_{IR}(\lambda)$ generated in the color sensors of FIGS. 4 and 5 upon illumination by a light beam of a predetermined number of photons F (photons/sec) per unit time over an entire wavelength range.
Figure 6C:
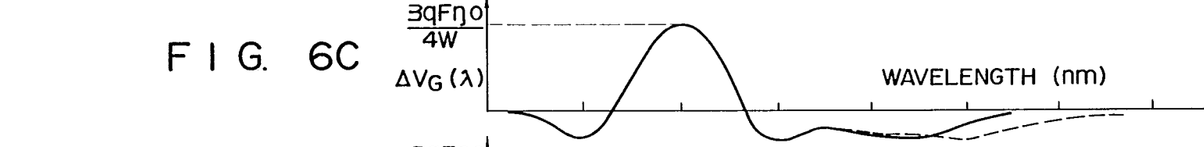
Figure 6D:
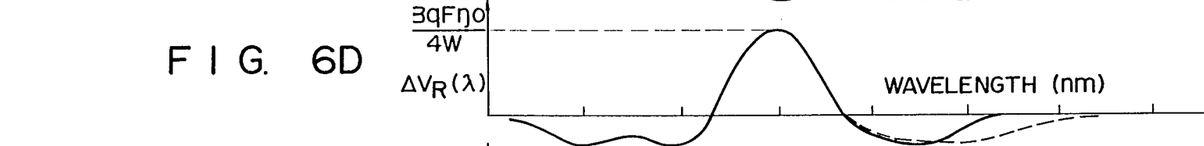
Figure 6E:
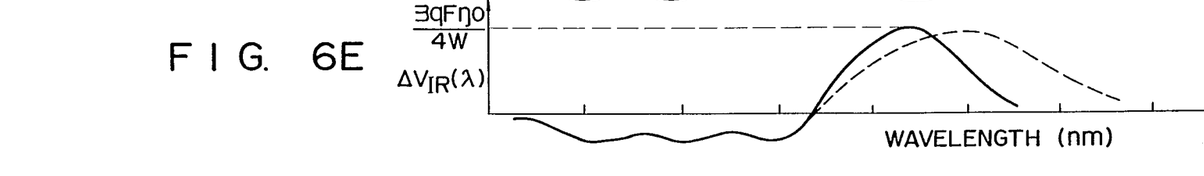

FIG. 6A shows the collection efficiency spectra $\eta_B(\lambda)$, $\eta_G(\lambda)$, $\eta_R(\lambda)$ and $\eta_{IR}(\lambda)$ of the respective photodiodes. FIGS. 6B to 6E show voltage spectra $\Delta V_B(\lambda)$, $\Delta V_G(\lambda)$, $\Delta V_R(\lambda)$ and $\Delta V_{IR}(\lambda)$ upon illumination by light of a predetermined number of photons F (photons/sec) per unit time over a whole wavelength region.

In FIGS. 6A to 6E, the solid lines show the waveforms for the color sensor of FIG. 4, and the dotted lines show the wavelengths for the color sensor of FIG. 5.

Even if monochromatic light of any arbitrary wavelength over a range from a visible to an infrared area is incident, it is possible to sense the color components by voltages generated across the respective photodiodes. Table 1 below shows the relation between the incident light wavelengths and the sign of the generated voltages:

TABLE 1

| Voltage generated | Wavelength (nm) | | | | | | |
|---|---|---|---|---|---|---|---|
| | 450 | 500 | 550 | 600 | 650 | 700 | 800 |
| $\Delta V_B(\lambda)$ | + | + | − | − | − | − | − |
| $\Delta V_G(\lambda)$ | − | + | + | + | − | − | − |
| $\Delta V_R(\lambda)$ | − | − | − | + | + | + | − |
| $\Delta V_{IR}(\lambda)$ | − | − | − | − | − | + | + |

That is, it is only necessary that the photodiode produces a blue component when $\Delta V_B(\lambda)$ is positive, a green component when $\Delta V_G(\lambda)$ is positive, a red component when $\Delta V_R(\lambda)$ is positive and an infrared component when $\Delta V_{IR}(\lambda)$ is positive. In this case, no color components are produced when the generation voltage is at a negative level. Needless to say, since the incident light strength F is in proportionate to generation voltage, the strength of the output color can be determined in accordance with the generation voltage.

With the infrared cut-filter 46 placed on the light receiving side, the infrared light component ceases to be sensed and thus $\eta_{IR}(\lambda)=0$. However, no infrared cut-filter 46 is required if the transparent metal layer 44IR is replaced by a non-transparent metal layer such as Al, Mo, Ti or Ag for forming an ohmic contact, or a non-transparent metal layer such as Pt, Au or W for forming a Schottky junction.

Where the light, of which the wavelength distribution of the photon number density is $F(\lambda)$, is incident to the sensor, a positive voltage is generated, in accordance with equations (24) to (27) across the photodiode having $\eta_m(\lambda)$, with respect to which $F(\lambda)$ has, as its function, to greatly overlap the $\eta_m(\lambda)$. Thus, the color output can be produced in accordance with the positive voltage. If, as set out above, the color sensor is so configured as not to be sensitive to the infrared light, it is possible to provide a color identification for the blue, green and red components even if the white-colored light containing the infrared components is incident on the color sensor.

Figure 7:
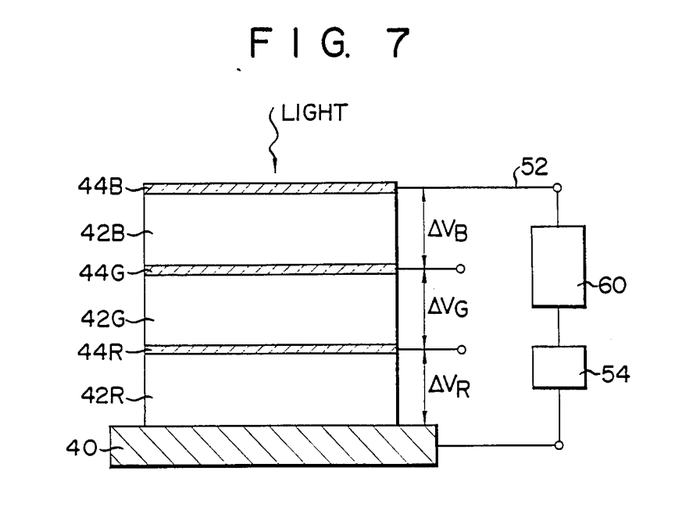
FIG. 7 is a cross-sectional view showing the color sensor according to a fourth embodiment of this invention.

The color sensor of the fourth embodiment of this invention will be explained below. FIG. 7 shows a model, in cross-section, showing a simplified arrangement of the color sensor.

The above-mentioned photodiodes 42B, 42G and 42R, sensitive to a blue, a green and a red color, respectively, are so arranged that they are series-connected with a corresponding transparent electrode (44G, 44R) between them. The connection terminal 40 is electrically connected by the closed circuit 52 to the transparent conductive layer 44B. 54 and 60 denote a power source and diode or resistor, respectively.

Figures 8, 9:
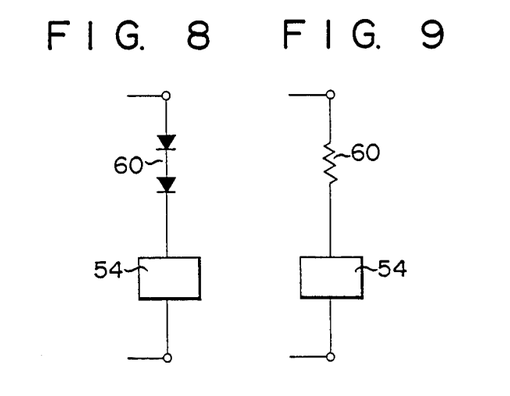
FIGS. 8 and 9 are circuit diagrams showing the details of circuit 60 in FIG. 7.

If the diode 60 is replaced by two diodes, as shown in FIG. 8, and the respective three photodiodes, and these two diodes are so set as to make their value $W_m$ equal to W, then the following voltages $\Delta V_B$, $\Delta V_G$ and $\Delta V_R$ are produced across the respective photodiodes.

$$\Delta V_B = q/5W \int F(\lambda)[4\eta_B(\lambda) - \eta_G(\lambda) - \eta_R(\lambda)]d\lambda \tag{28}$$

$$\Delta V_G = q/5W \int F(\lambda)[4\eta_G(\lambda) - \eta_R(\lambda) - \eta_B(\lambda)]d\lambda \tag{29}$$

$$\Delta V_R = q/5W \int F(\lambda)[4\eta_R(\lambda) - \eta_B(\lambda) - \eta_G(\lambda)]d\lambda \tag{30}$$

These equations hold even if the diode 60 is replaced by a resistor having a value of 2/W, as shown in FIG. 9. As evident from a comparison between equations (28) to (30) and (24) to (26), the sensitivity of the photodiodes to the incident light components can be further enhanced by the above-mentioned specific arrangement. Needless to say, if the number of diodes or resistive values are increased as in the circuit element 60, the color sensitivity can be, still further increased. The diodes may be freely connected providing their polarities are properly selected.

In order to equalize the value $W_m$ of the respective photodiodes and diodes, a resistor of a resistance level at which the inherent parallel resistance of the respective photodiodes can be disregarded can effectively be connected across the respective photodiodes and diodes.

Figure 10:
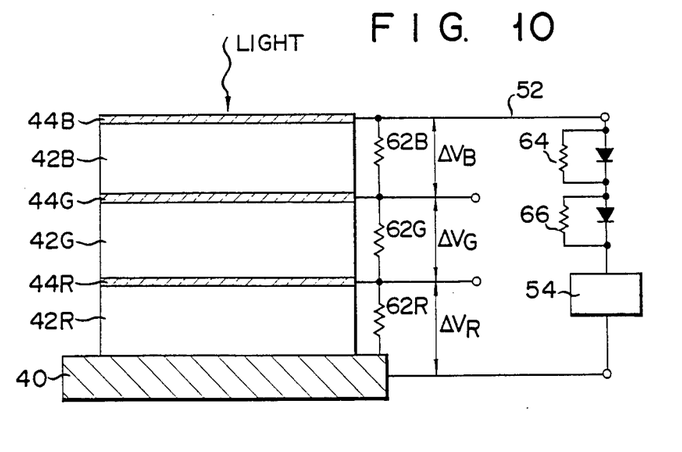
FIG. 10 is a cross-sectional view showing a modification of the embodiment of FIG. 7.

FIG. 10 shows a modification of the color sensor of FIG. 7. Resistors 62B, 62G and 62R are connected across photodiodes 42B, 42G and 42R, respectively, and resistors 64 and 66 are connected across corresponding diodes in a closed circuit 52. The resistors 62B, 62G and 62R may be so designed as to enable their resistances to be varied in the manner of module units. In this case, the diodes in the closed circuit 52 are not required.

The above-mentioned arrangement assures a ready design on the operation of the color sensor. It is also possible to readily adjust the magnitudes of the generation voltages $\Delta V_B$, $\Delta V_G$ and $\Delta V_R$ but adjusting the resistive values of the resistors 62B, 62G, 62R, 64, 66, etc. That is, the value W can be made greater based on equation (17) by making, for example, the resistive values of the resistors 62B, 62G, 62R, 64 and 66 smaller, and thus the value $\Delta V_m$ can be made smaller based on equation (20). As a result, a ready conversion from equation (7) to equation (8) is permitted, and it is possible to readily control the generation voltage against the intensity of the incident light.

A Schottky junction may be provided for the respective photodiodes 42B, 42G and 42R using thin metal film such as Pt, Au, W, Ir, Pd, Rh, Ni or Cr. In addition to the Schottky junction, a PN junction, PIN junction, IN junction, PI junction or a combination thereof may be realized as a semiconductor junction for the respective photodiodes 42B, 42G and 42R.

Figure 11:
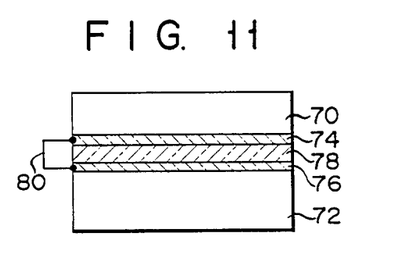
FIGS. 11 and 12 are cross-sectional views showing the color sensor according to fifth and sixth embodiments of this invention.

Although, the above-mentioned embodiments, the photodiodes are connected in a stacked fashion through the connection terminals of the transparent conductive layers and metal layers, any other method may be employed for their connection. For example, the connection terminals of the respective photodiodes may be connected with a transparent layer between them so that the connection will be short-circuited, as shown in FIG. 11. That is, in FIG. 11, numbers 70 and 72 denote the photodiodes; 74 and 76 denote the connection terminals; and 78 denotes the transparent insulating layer. The photodiodes 70 and 72 are directly connected by a connection 80.

Figure 12:
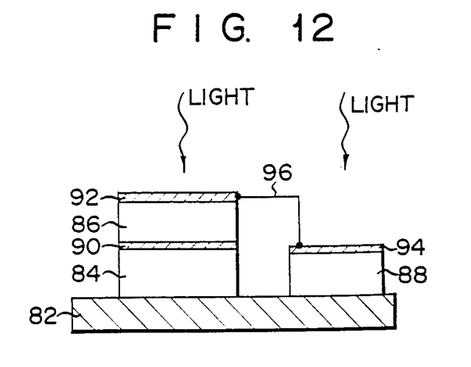

As shown in FIG. 12, photodiodes may be arranged in a plane, and series-connected. That is, in FIG. 12, 82 denotes a conductive substrate such as stainless steel; 84, 86 and 88 denotes photodiodes; and 90, 92 and 94 denote transparent conductive layers. The photodiodes 86 and 88 are series-connected by a connection 96, in which case they are readily short-circuited through the conductive substrate 82. In other words, the photodiodes 84 and 88 are series-connected through the conductive substrate 82, with both the terminals of the color sensor short-circuited by the connection 96.

The color sensor according to a seventh embodiment of this invention will be explained below by referring to FIGS. 13 to 16. The principle of the color sensor will color sensor first be explained.

Figure 13:
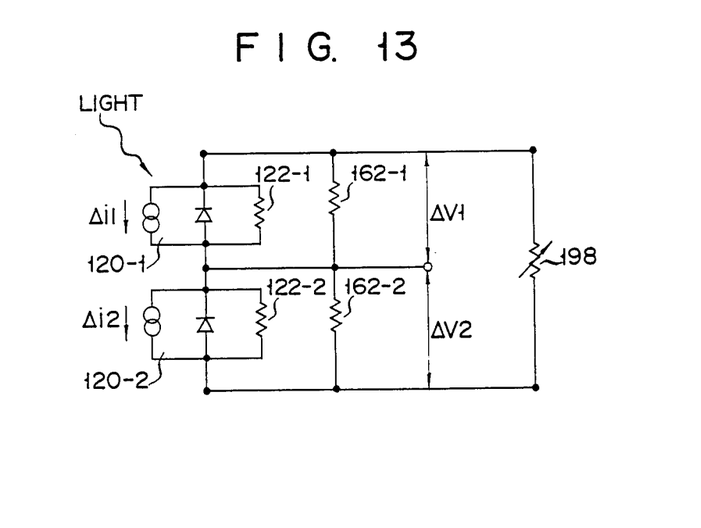
FIG. 13 shows an equivalent circuit of a color sensor according to a seventh embodiment of this invention.

FIG. 13 shows an equivalent circuit representing a principle of the color sensor. In FIG. 13, numerals 120-1 and 120-2 denote photodiodes as photovoltaic cells. The photodiodes 120-1 and 120-2 have their photosensitive wavelength areas partly overlapped and are series-connected, with their polarities oriented in the same direction. 122-1 and 122-2 indicate the parallel resistances inherent in the respective photodiodes 120-1 and 120-2. Fixed resistors 162-1 and 162-2 are connected respectively across the photodiodes 120-1 and 120-2. Note that these resistors 162-1 and 162-2 have sufficiently small resistances against the parallel resistances 122-1 and 122-2. A variable resistor 198 is connected between both terminals of a series-connection of the photodiodes 120-1 and 120-2.

When light is incident on the photodiode array, photocurrents $\Delta i_1$ and $\Delta i_2$ are generated across the photodiodes 120-1 and 120-2 of the array. In this case, voltages $\Delta V_1$ and $\Delta V_2$ are generated respectively across the photodiodes 120-1 and 120-2 in accordance with the wavelength of the incident light, resistive values $R_1$ and $R_2$ of the fixed resistors 162-1 and 162-2, and resistive value $R_3$ of the variable resistor 198. The voltages $\Delta V_1$ and $\Delta V_2$ can be given below:

$$\Delta V_1 = \frac{(W_2 + W_3) \cdot \Delta i_1 - W_3 \cdot \Delta i_2}{W_1 W_2 + W_2 W_3 + W_3 W_1} \quad (31)$$

$$\Delta V_2 = \frac{(W_3 + W_1) \cdot \Delta i_2 - W_3 \cdot \Delta i_1}{W_1 W_2 + W_2 W_3 + W_3 W_1} \quad (32)$$

Equations (31) and (32) holds somewhat, provided that $$q \cdot \Delta V_m << n_m kT \ (m=1, 2)$$

where:
q: electron charge
$n_1, n_2$: n values of the resistive photodiodes
k: Boltzmann's constant
T: absolute temperature
$W_1$, $W_2$ and $W_3$ in equations (31) and (32) are given below:

$$W_1 = \frac{q \cdot I_{01}}{n_1 kT} + \frac{1}{R_{S1}} + \frac{1}{R_1} \quad (33)$$

$$W_2 = \frac{q \cdot I_{02}}{n_2 kT} + \frac{1}{R_{S2}} + \frac{1}{R_2} \quad (34)$$

$$W_3 = \frac{1}{R_3} \quad (35)$$

Here, $I_{01}$ and $I_{02}$ indicate saturated current values of the respective photodiodes 120-1 and 120-2; $R_{S1}$, $R_{S2}$ indicate parallel resistances 122-1 and 122-2 of the respective photodiodes; and $R_1$, $R_2$ and $R_3$ indicate the resistive values of the fixed resistors 162-1 and 162-2 and variable resistor 198.

Where $R_1$ and $R_2$ are sufficiently smaller than $R_{S1}$ and $R_{S2}$, equations (33), (34) and (35) can, ordinarily, be expressed, approximately, as follows:

$$W_m = 1/R_m \quad (36)$$

$$(m=1, 2, 3)$$

If, on the other hand, monochromatic light (wavelength $\lambda$) with $F(\lambda)$ number of photons per unit time is incident on the sensor and the collection efficiencies of the respective photodiodes 120-1 and 120-2 are $\eta_1(\lambda)$ and $\eta_2(\lambda)$, respectively, the generated photocurrents $\Delta i_1$ and $\Delta i_2$ can be expressed as follows:

$$\Delta i_1 = q \cdot F(\lambda) \eta_1(\lambda) \quad (37)$$

$$\Delta i_2 = q \cdot F(\lambda) \eta_2(\lambda) \quad (38)$$

Substituting equations (36), (37) and (38) into equations (31) and (32) gives:

$$\Delta V_1 = \frac{q \cdot F(\lambda) \left[ \left( \frac{1}{R_2} + \frac{1}{R_3} \right) \eta_1(\lambda) - \frac{1}{R_3} \cdot \eta_2(\lambda) \right]}{\frac{1}{R_1 R_2} + \frac{1}{R_2 R_3} + \frac{1}{R_3 R_1}} \quad (39)$$

$$\Delta V_2 = \frac{q \cdot F(\lambda) \left[ \left( \frac{1}{R_3} + \frac{1}{R_1} \right) \eta_2(\lambda) - \frac{1}{R_3} \cdot \eta_1(\lambda) \right]}{\frac{1}{R_1 R_2} + \frac{1}{R_2 R_3} + \frac{1}{R_3 R_1}} \quad (40)$$

As evident from the above equations, with, for example, $R_1$ and $R_2$ fixed and $R_3$ variable, $R_3$, which renders ($\Delta V_1$, $\Delta V_2$) zero level in accordance with the wavelength of the incident light, is uniquely determined. Thus, the wavelength of the incident light can be sensed by finding $R_3$.

Briefly, with $R_1 = R_2 = R_0$, and with $R_3$ variable, $R_3$, which renders $\Delta V_1$ zero level, becomes:

$$R_3 = R_0 \{ (\eta_2(\lambda)/\eta_1(\lambda)) - 1 \} \quad (41)$$

and $R_3$, which renders $\Delta V_2$ zero level, becomes:

$$R_3 = R_0 \{ (\eta_1(\lambda)/\eta_2(\lambda)) - 1 \} \quad (42)$$

That is, within a range of the mutually overlapped wavelength region of the respective diodes 120-1 and 120-2, a wavelength in $\eta_2(\lambda) > \eta_1(\lambda)$ is sensed through the resistive value $R_3$ which renders $\Delta V_1$ zero level, and a wavelength in $\eta_2(\lambda) < \eta_1(\lambda)$ is sensed through the resistive value $R_3$ which renders $\Delta V_2$ zero level.

Figure 14:
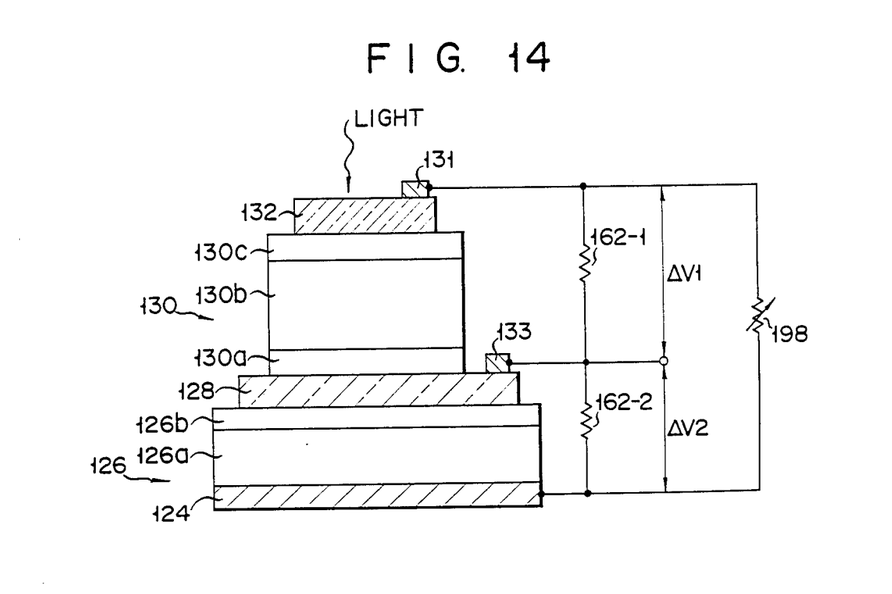
FIG. 14 is a cross-sectional view showing the color sensor according to the seventh embodiment of this invention.

An explanation will now be given of the practical embodiment of the invention. FIG. 14 is a cross-sectional view showing a color sensor. In FIG. 14, a P-type, polycrystalline silicon substrate 126a has a reverse electrode 124 such as an Al. An N-type, microcrystalline silicon film 126b of a thickness of 10 to 30 nm is formed on the substrate 126a to provide a first photodiode 126 on which a transparent conductive film 128 such as ITO or SnO₂ is formed. Then, a PIN-type second photodiode 130 is formed on the resultant structure. Note that the photodiode 130 comprises a P-type, amorphous silicon film 130a of a thickness of 10 to 100 nm, an I-type amorphous silicon film 130b of a thickness of 10 to 1000 nm and an N-type, amorphous silicon film 130c of a thickness of 10 to 100 nm, and that these films 130a, 130b and 130c are formed in that order, as shown in FIG. 14. As evident from FIG. 14, the first and second photodiodes 126 and 130 are series-connected in a stacked fashion with their polarities oriented in the same direction. An approximately 80 nm-thick ITO film 132 is formed on the upper surface (the light receiving surface) of the second diode 130. Note that the ITO film 132 serves also as an antireflection film. 131 and 133 show metallic terminal electrodes. A fixed resistor 162-2 is connected between the electrodes 124 and 133; a fixed resistor 162-1 is connected between the electrodes 133 and 131; and a variable resistor 198 is connected between the electrodes 124 and 131.

The amorphous silicon film and microcrystalline silicon film are formed by a known method for effecting a glow discharge decomposition of raw material through an application of a high frequency power of 13.56 MHz. A silane ($SiH_4$) gas and diborane ($B_2H_6$) gas may be introduced into a plasma reactor when a P-type, amorphous silicon is to be formed; the silane gas when an I-type amorphous silicon film is to be formed; and the silane gas and phosphin ($PH_3$) gas when an N-type, amorphous silicon film is to be formed. The substrate temperature may be set in a range of 150° to 250° C. and the gas pressure may be set within a range of 1 to 2 torrs.

In this arrangement, a resistive value which renders the terminal-to-terminal voltage ($\Delta V_1$ and $\Delta V_2$) zero level is evaluated from a varying range of the resistive values of the variable resistor 198. The result of this evaluation will be explained below in connection with the wavelength corresponding to this resistive value.

Figure 15:
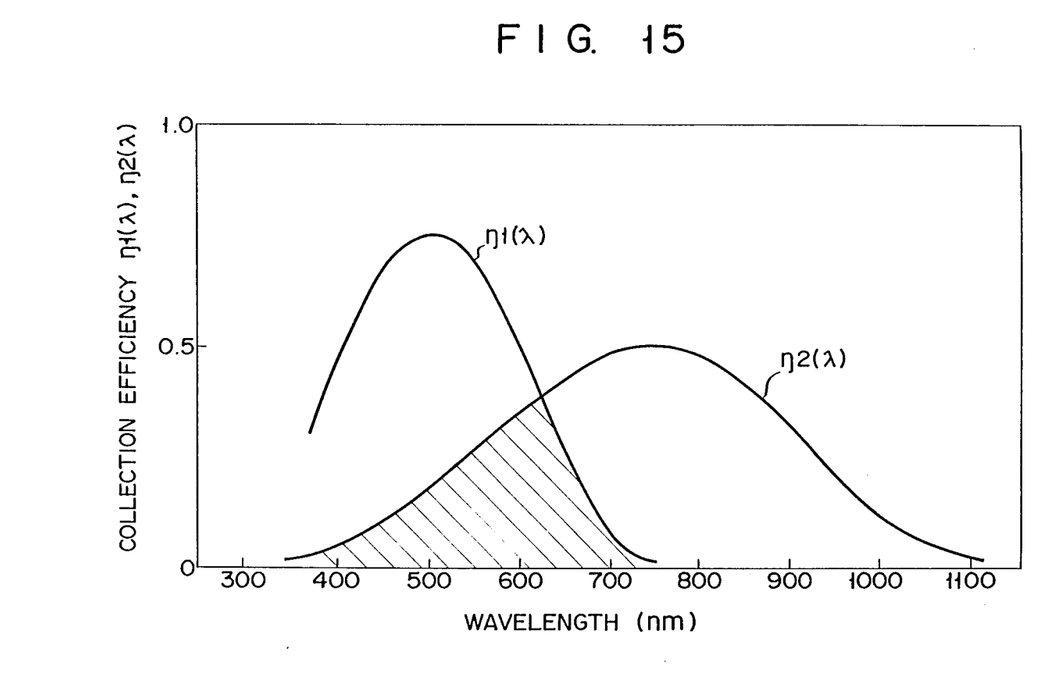
FIG. 15 shows a collection efficiency spectrum of each photodiode of the color sensor of FIG. 7.

FIG. 15 shows the collection efficiency spectra $\eta_1(\lambda)$ and $\eta_2(\lambda)$ of the respective photodiodes 126 and 130. As explained in connection with equations (41) and (42), the embodiment of this invention can sense the wavelength in the overlapped wavelength area indicated by hatched lines in FIG. 15.

Figure 16:
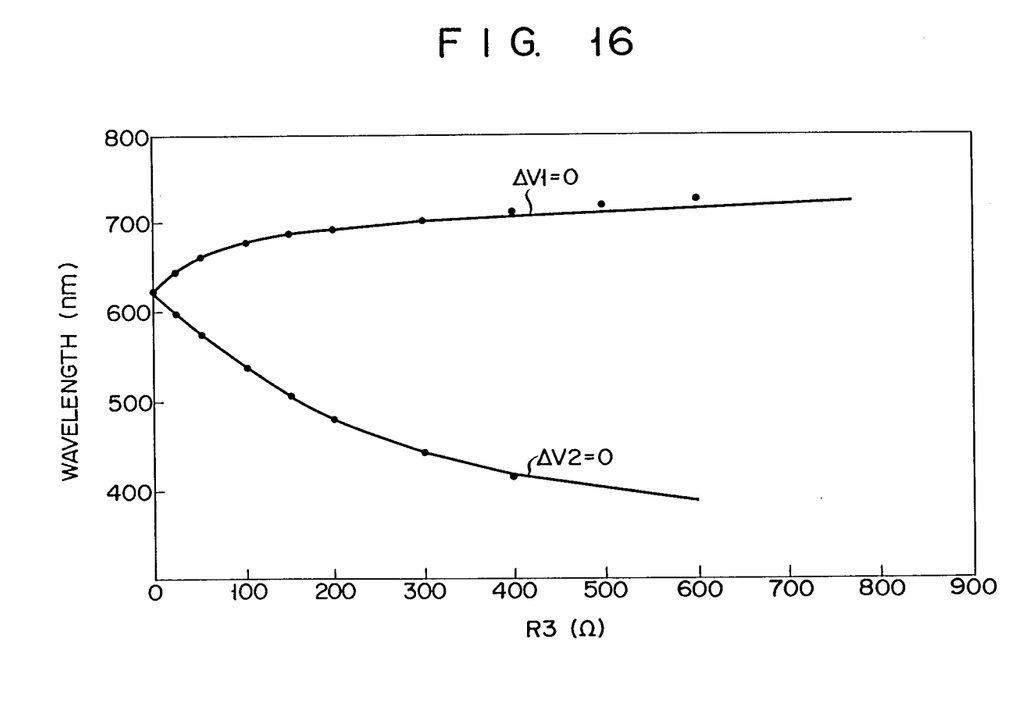
FIG. 16 is a graph showing the relation between a resistance of a variable resistor, which renders a voltage across each photodiode of the seventh embodiment zero in level, and the wavelength of the incident light.

FIG. 16 shows the relation of $R_3$ of the variable resistor 198, as given below, to the wavelength. Note that said $R_3$ which renders the element-to-element voltage ($\Delta V_1$ and $\Delta V_2$) zero level is theoretically obtained through the evaluation of equations (41) and (42) and with the use of $\eta_1(\lambda)$ and $\eta_2(\lambda)$ in FIG. 15. In FIG. 16, the upper curve shows the relation of $R_3$ to the wavelength at $\Delta V_1=0$, and the lower curve shows the relation of $R_3$ to the wavelength at $\Delta V_2=0$. In FIG. 16, solids circles show measured values which are in agreement with the theoretical values.

According to this embodiment, a correlation exists between the resistive value $R_3$ of the variable resistor, which renders the terminal-to-terminal voltage ($\Delta V_1$ and $\Delta V_2$) zero level, and the incident light wavelength. The evaluation of $R_3$ permits the incident light wavelength to be sensed readily without requiring any complex processing circuit as in the conventional color sensor.

Although the above-mentioned embodiment has been explained as sensing visible light of about 400 to 700 nm, it is possible to arbitrarily set the wavelength sensing range by selecting a proper combination of photodiodes whose photosensing wavelength areas differ slightly. If, as a semiconductor material for the photodiodes, use is made of a proper combination of Si, Ge, AlAs, AlSb, GaP, GaAs, GaAlAs, GaSb, InP, InSb, ZnS, ZnSe, ZnTe, CdS, CdTe, SiC, PbTe, $Cu_2S$ and CdSe, it is possible to obtain a photodiode pair which is sensitive to any arbitrary wavelength corresponding to the respective forbidden band gap.

Although in the above-mentioned embodiment the two photodiodes are arranged one over the other in a stacked fashion, the color sensor may also been obtained by arranging two photodiodes on a predetermined substrate such that they can be series-connected in a planar fashion.

What is claimed is:

1. A color sensor comprising:
   a plurality of photovoltaic cells each having a different photosensing wavelength area, and electrically connected together in a series configuration;
   connecting means electrically connected across both end terminals of said series-connected photovoltaic cells to provide an electrically closed circuit; and
   sensing means for sensing a voltage generated across the respective photovoltaic cells, and for evaluating colors of light incident on the color sensor.

2. A color sensor according to claim 1, in which said photovoltaic cells have at least one kind of semiconductor junction selected from the group consisting of PN, PIN, IN, PI and Schottky junctions.

3. A color sensor according to claim 1, in which said plurality of photovoltaic cells are electrically, series-connected with a transparent conductive layer therebetween.

4. A color sensor according to claim 3, in which said transparent conductive layer is an oxide having one element selected from the group consisting of In and Sn.

5. A color sensor according to claim 3, in which said transparent conductive layer is made of one element selected from the group consisting of Pt, Au, Ir, Pd, Rb and Ni.

6. A color sensor according to claim 1, in which both end terminals of said series-connected photovoltaic cells are electrically, short-circuited through said connecting means.

7. A color sensor according to claim 1, in which said connecting means includes at least one of a power source, diode and resistor.

8. A color sensor according to claim 1, in which a constant voltage is applied across both end terminals of said series connected photovoltaic cells through said connecting means.

9. A color sensor according to claim 1, further comprising filter means, arranged at a light incident portion of said photovoltaic cells, for adjusting the intensity of incident light.

10. A color sensor according to claim 1, further comprising an infrared cut-filter arranged at a light incident portion of said photovoltaic cells, and in which at least one of said plurality of photovoltaic cells is an infrared sensor.

11. A color sensor according to claim 1, in which said plurality of photovoltaic cells are electrically, series-connected at at least one portion through an aluminum layer.

12. A color sensor according to claim 1, in which said plurality of photovoltaic cells are stacked on top of each other.

13. A color sensor according to claim 1, further comprising a plurality of resistors, each of which is electrically connected in parallel with its respective photovoltaic cell.

14. A color sensor according to claim 1, in which, when a forward voltage is generated across both terminals of said photovoltaic cell, said sensing means senses color components corresponding to said photovoltaic cell.

15. A color sensor according to claim 1, in which:
said color sensor is comprised of two photovoltaic cells whose photosensing wavelength areas partly overlap;
fixed resistors are each electrically connected in parallel with their respective photovoltaic cells; and
said connecting means has a variable resistor connected across both end terminals of said series-connected photovoltaic cells,
whereby a resistive value of said variable resistor is caused to vary so as to render a voltage across both terminals of at least one of said two photovoltaic cells zero level, at which time a wavelength of incident light is determined based on said resistive value of said variable resistor.

16. A color sensor according to claim 15, in which said two photovoltaic cells are stacked one over the other on the surface of a predetermined substrate.

17. A color sensor according to claim 15, in which said two photovoltaic cells are arranged in a plane on the surface of said substrate.

* * * * *